United States Patent [19]

Pfaff

[11] Patent Number: 4,660,282
[45] Date of Patent: Apr. 28, 1987

[54] METHOD AND APPARATUS FOR UNLOADING ELECTRONIC CIRCUIT PACKAGES FROM ZERO INSERTION FORCE SOCKETS

[76] Inventor: Wayne K. Pfaff, 1316 Savannah, Irving, Tex. 75062

[21] Appl. No.: 809,263

[22] Filed: Dec. 16, 1985

[51] Int. Cl.[4] .......................... H05K 3/00; B23P 19/00
[52] U.S. Cl. ......................................... 29/829; 29/700; 209/542; 221/73; 414/222; 414/224; 414/416
[58] Field of Search .......................... 29/829, 764, 700; 209/542; 414/222, 224, 416; 221/73

[56] References Cited

U.S. PATENT DOCUMENTS

| | | | |
|---|---|---|---|
| 4,285,433 | 8/1981 | Garrett, Sr. et al. | 209/573 |
| 4,370,805 | 2/1983 | Pfaff | 414/224 X |
| 4,439,917 | 4/1984 | Pearson | 29/741 X |
| 4,567,652 | 2/1986 | Gussman et al. | 29/741 X |
| 4,584,764 | 4/1986 | Gussman | 29/762 X |
| 4,607,761 | 8/1986 | Wright et al. | 221/73 X |

*Primary Examiner*—Howard N. Goldberg
*Assistant Examiner*—Carl J. Arbes
*Attorney, Agent, or Firm*—Kanz, Scherback & Timmons

[57] ABSTRACT

Disclosed are methods and apparatus for rapidly and automatically unloading electronic circuit packages from zero insertion force sockets on a burn-in board or the like by inverting the burn-in board and placing sequential rows of the sockets in compressive rolling contact with a roller supported beneath the burn-in board. Means are provided to capture the electronic circuit packages as they fall from the sockets and to store the packages in carrier tubes.

27 Claims, 14 Drawing Figures

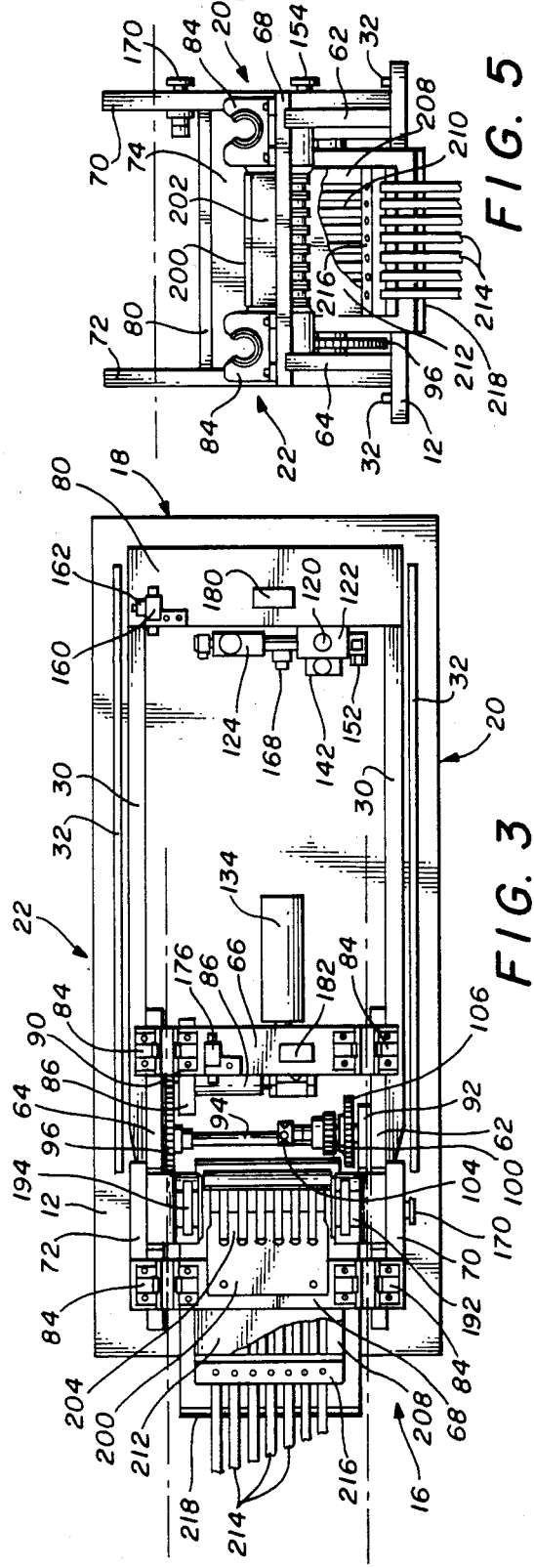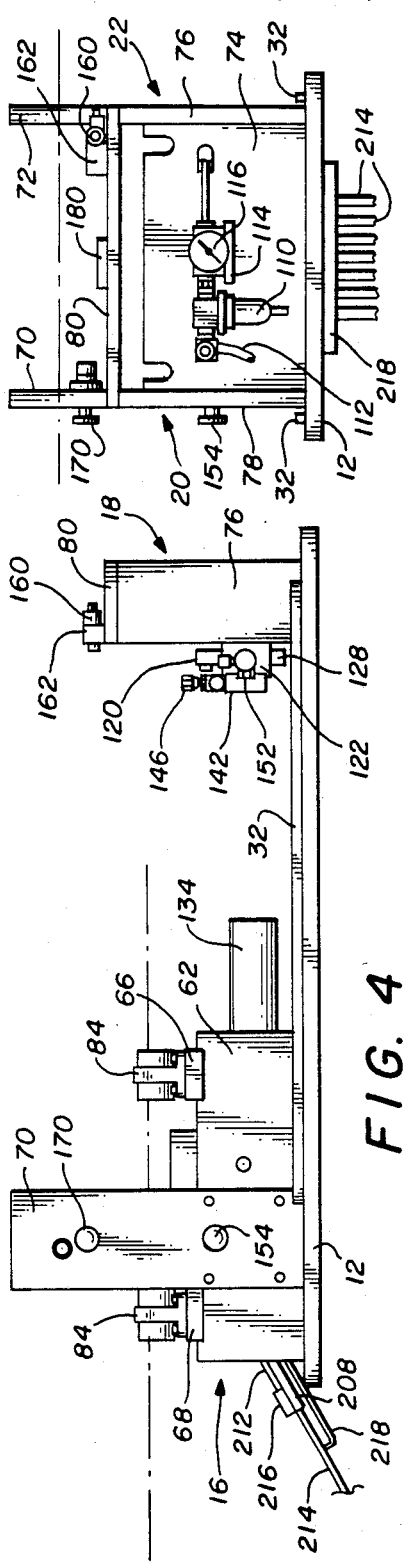

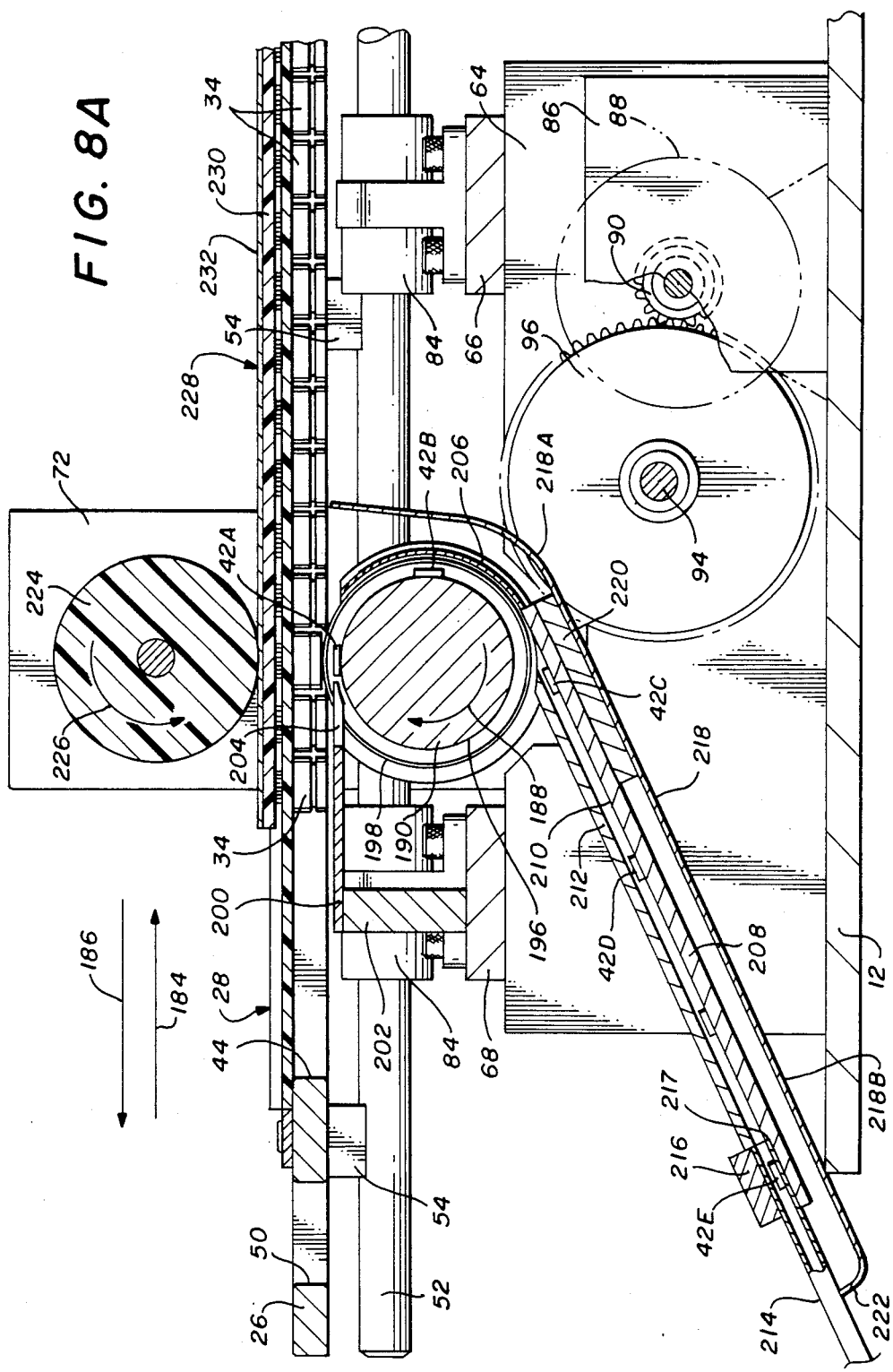

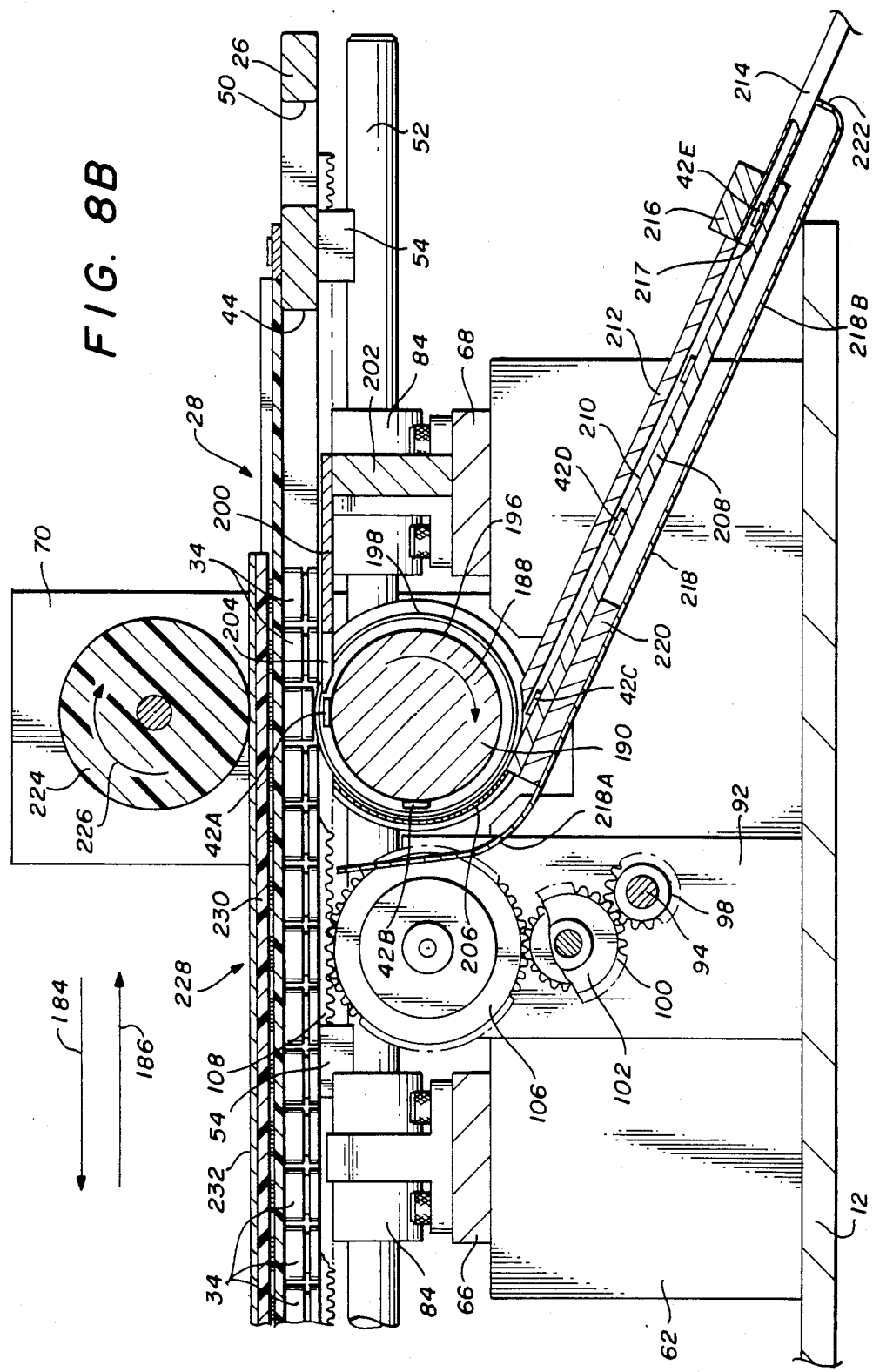

METHOD AND APPARATUS FOR UNLOADING ELECTRONIC CIRCUIT PACKAGES FROM ZERO INSERTION FORCE SOCKETS

FIELD OF THE INVENTION

This invention relates generally to electronic circuit packages. More particularly, it relates to apparatus for rapidly unloading electronic circuit packages from zero insertion force sockets on burn-in boards or the like.

BACKGROUND OF THE INVENTION

In the semiconductor electronics industry, various semiconductor components are packaged in standard component packages. One such standard package is the dual-in-line package (known as a DIP) which essentially comprises an enclosed package containing the semiconductor component with parallel rows of leads extending from opposite edges of the package. Other known package designs include the flat pack and, more recently, the leadless chip carrier developed to contain large scale integration (LSI) type semiconductor components. Such LSI components are difficult to house efficiently in a standard DIP package because of the complexity of the interconnection between the package and the chip. In addition, a DIP package for an LSI component must be extended to a length which occupies an undesirably large surface area on a printed circuit board to accommodate the number of leads required to connect the device to the printed circuit board. The leadless chip carrier comprises a substantially flat rectangular ceramic or plastic base piece with a centrally located cavity on one face thereof. The chip is mounted on the floor of the cavity and the cavity enclosed and hermetically sealed with a ceramic or plastic cover. Terminal lands or contacts are arranged along the edges and/or the sides of the base piece providing a much more compact design than DIP packages.

Because of the complexity of integrated circuits and other semiconductor components, particularly LSI components, it has become desirable to test each component. Standard testing procedures include mounting a plurality of semiconductor components on a test board, known as a burn-in board, and simultaneously subjecting the components to various environmental and electrical stresses while mounted on the burn-in board. The components are then removed from the burn-in board and tested. Those components failing the functional tests are discarded or classified according to test performance. Although the configuration of the burn-in board may vary for various reasons, all burn-in boards generally arrange the components in rows and columns of sockets mounted on the burn-in board with the number and spacing of the sockets varying according to the testing methods and the component to be tested. Various socket designs are also employed for similar reasons.

Since it is desirable to burn-in or test the entire production output from an assembly line of semiconductor components, it is also desirable that the loading and unloading of the burn-in board be accomplished as rapidly and economically as possible. For this purpose, various configurations of burn-in boards are employed. However, semiconductor components, even when mounted in packages, must be handled carefully to avoid damage to themselves or to the package. For instance, the parallel leads on a DIP may be damaged or bent while being inserted on a socket on a burn-in board if not aligned correctly with the socket. Even if aligned correctly, the leads may become worn through repeated insertion and removal from a socket. Further, the force required to insert and remove electronic circuit packages of all types from a conventional socket imposes undesirable stresses on the component and the package. For this reason, zero insertion force sockets have been developed and, in particular, such sockets have been employed on burn-in boards. It is to this type of zero insertion force socket that the present invention is directed and in particular to the problem of unloading the electronic circuit package therefrom.

Zero insertion force sockets for DIPs provide an opening for each lead on the DIP. The openings are of a much larger diameter than the lead and thus the component may be inserted or removed therefrom without appreciable resistance. When the component is inserted in the socket, a mechanism on the socket is engaged to grip the leads of the DIP and secure it in place. The mechanism must be disengaged to allow the component to be removed. It is known to resiliently bias the mechanism to an engaged position, requiring a compressive force to be applied to the socket in order to shift the mechanism to a disengaged position and enabling a DIP to be inserted or removed from the socket without substantial resistance.

U.S. Pat. No. 4,491,397, issued Jan. 1, 1985, shows a zero insertion force socket for use with a leadless chip carrier. The socket includes a housing having a rectangular cavity for receiving the leadless chip carrier. A plurality of rigid contacts are vertically mounted in the housing about the cavity and are biased to engage the terminal lands on the leadless chip carrier when placed in the cavity. A spreader is mounted on the housing and is capable of reciprocal motion in a vertical direction although it is resiliently biased to an upper position. When the socket is compressed by forcing the spreader downwardly toward the housing, the spreader deflects the contacts outwards from the cavity, thus allowing the leadless chip carrier to enter the cavity without resistance. When the spreader is released, it automatically resumes the upper position, allowing the contacts to spring inwardly to engage the terminal lands on the leadless chip carrier and secure it in the socket. The leadless chip carrier may be released by compressing the socket a second time as outlined above and extracting the leadless chip carrier.

The electronic circuit packages, of whatever type, may be loaded and unloaded by hand from the zero insertion force sockets on a burn-in board. This method, however, is extremely time-consuming and therefore expensive. Another problem associated with electronic circuit packages is that they must frequently be inserted into carrier tubes in an end-to-end relationship after being unloaded from the socket. The carrier tubes are widely used to store and transport the electronic circuit packages in large numbers. It is undesirable to individually load the electronic circuit packages into the carrier tubes by hand. Finally, any apparatus in contact with the electronic circuit packages may damage the semiconductor component contained therein if electric current is present or if static electricity is allowed to accumulate. None of these difficulties are satisfactorily overcome by existing equipment or methods for unloading electronic circuit packages from burn-in boards or the like.

SUMMARY OF THE INVENTION

This invention provides a method and apparatus for rapidly and efficiently unloading electronic circuit packages from zero insertion sockets mounted in a rectangular array on a burn-in board or the like. The method, in one embodiment, includes the steps of supporting the array of sockets in an inverted position; providing a roller; and passing the inverted array of sockets over the roller in compressive rolling contact therewith so as to unload the electronic circuit packages. Alternatively, after the socket has been compressed the electronic circuit packages may be extracted from the socket by mechanical means or by suction without requiring that the burn-in board be inverted.

The apparatus disclosed to accomplish this process includes a housing supporting a receptacle for supporting the burn-in board in an inverted position. Preferably, the apparatus is entirely pneumatically actuated and constructed of conductive materials which are grounded to avoid any possible electrical damage to the electronic circuit carriers. The receptacle is capable of reciprocal horizontal motion with respect to the housing between first and second positions. A roller is rotatively mounted in the housing beneath the receptacle. The roller is positioned so that it is placed in compressive rolling contact with the inverted sockets on the burn-in board as the receptacle and board are shifted to the second position. As each successive row of sockets on the burn-in board is compressed by the roller, the electronic circuit packages contained therein simultaneously fall from the sockets.

Means are provided to capture the electronic circuit packages as they are unloaded from the sockets and transport them to carrier tubes. In the preferred embodiment of the invention the roller is provided with concentric slots, each aligned with one of the rows of sockets on the burn-in board. As a row of the electronic circuit packages fall from the sockets they are each received in one of the slots in the roller. The roller is induced to rotate when in rolling contact with the sockets of the burn-in board, thus the electronic circuit carriers are carried in the roller slots as the roller rotates. A wiper is positioned beneath the slotted roller and conveys the electronic circuit packages as they fall from the slots on the roller to a row of aligned carrier tubes. The electronic circuit packages from each column on the burn-in board are sequentially placed in the carrier tube aligned with that column in end to end relationship until the carrier tube is filled. The carrier tubes are then replaced with an empty carrier tube for receipt of further electronic circuit packages from the burn-in board. When the burn-in board reaches its second position all of the sockets will have been unloaded into the carrier tubes.

In one embodiment of the invention, a second roller is rotatively mounted on the housing above the receptacle and opposite the slotted roller. A pad is interposed between the burn-in board and the second roller and comprises an upper rigid layer in rolling contact with the second roller and a lower cushioning layer in contact with the burn-in board. The second roller and pad apply pressure to support the burn-in board as the sockets are compressed and the electronic circuit packages are unloaded.

DESCRIPTION OF THE DRAWINGS

So that the manner in which the above recited features and advantages of the invention, as well as others which will become apparent to those skilled in the art, are obtained and can be understood in detail, a more particular description of the invention briefly summarized above may be had by reference to the embodiments thereof which are illustrated in the accompanying drawings, which drawings form a part of the specification and in which like numerals depict like parts in the several views. It is noted, however, that the appended drawings illustrate only a preferred embodiment of the invention and are therefore not to be considered limiting of its scope, for the invention may admit to other equally effective embodiments.

FIG. 3 is a top view of the apparatus of FIG. 2 with the index plate and burn-in board removed.

FIG. 4 is a right side view of the apparatus of FIG. 3.

FIG. 5 is a front end view of the apparatus of FIG. 3.

FIG. 6 is a rear end view of the apparatus of FIG. 3.

FIG. 8A is a cross-sectional view of the apparatus of FIG. 2 along view 8A—8A.

FIG. 8B is a cross-sectional view of the apparatus of FIG. 2 along view 8B—8B.

DETAILED DESCRIPTION OF THE INVENTION

Figure 1:
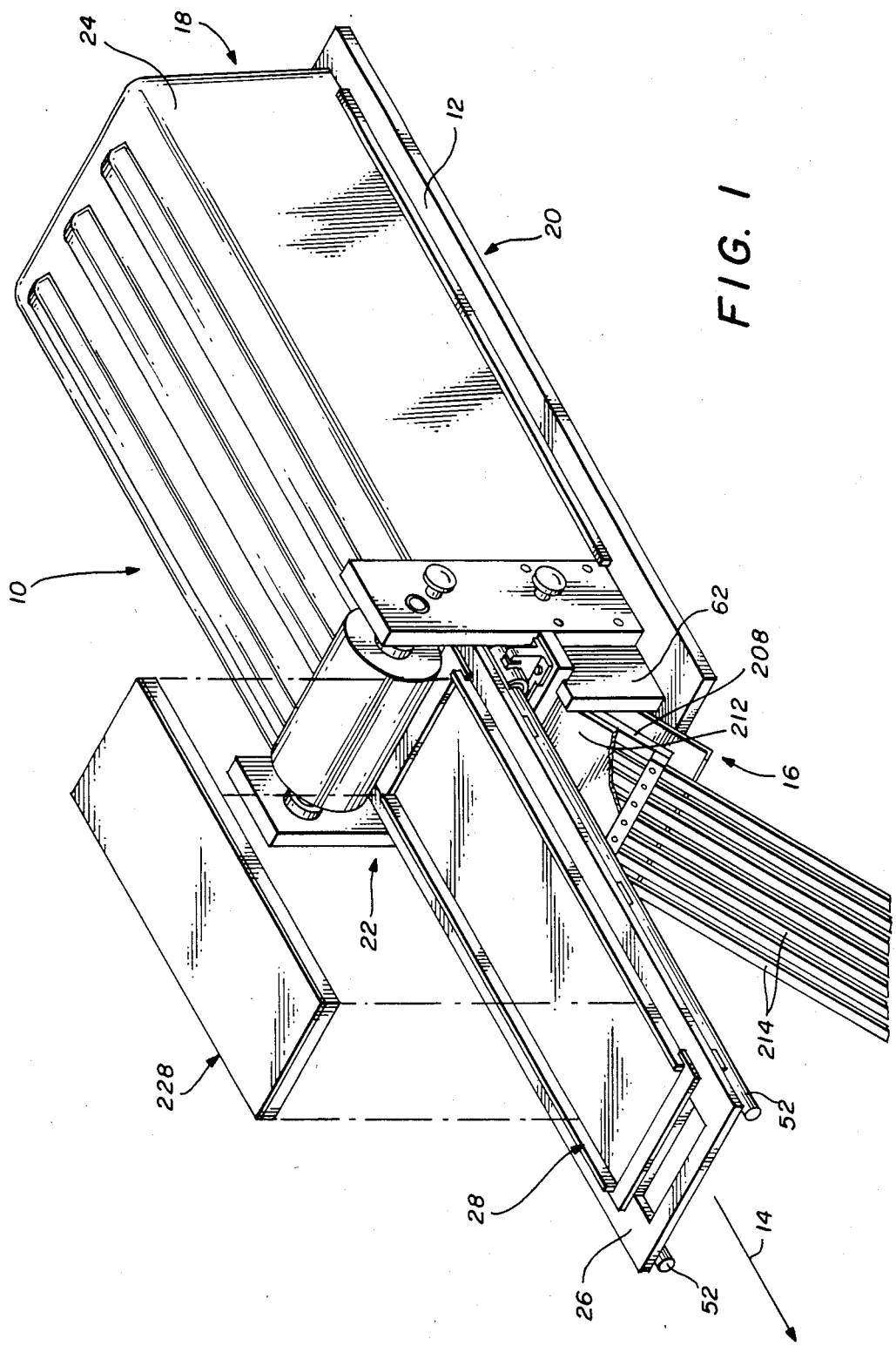
FIG. 1 is a perspective view of apparatus according to this invention in a first position and including a burn-in board.
Figure 2:
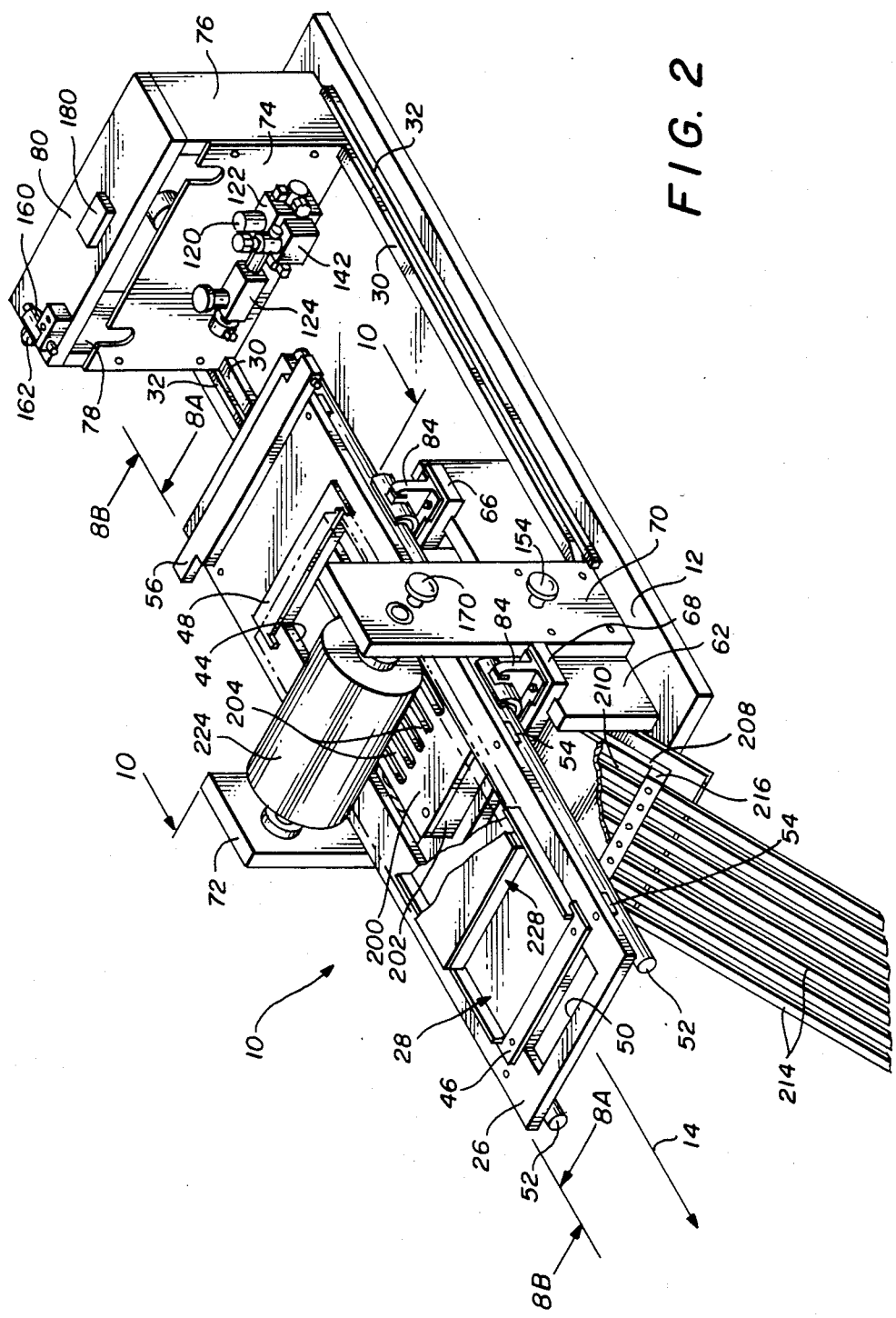
FIG. 2 is a perspective view of the apparatus of FIG. 1 with the shroud removed and the index plate partially inserted into the housing of the apparatus.

Referring now to FIG. 1, the reference numeral 10 generally indicates the apparatus of the present invention having a housing which includes a base plate 12 and defines longitudinal axis 14, front end 16, rear end 18, right side 20 and left side 22. Shroud 24 is mounted on the base plate and encloses the apparatus during operations. Shroud 24 is constructed of a rigid monolithic molded plastic piece. Preferably, the shroud and all the materials from which the components of the apparatus and the housing are constructed of materials that are electrically conductive to prevent the accumulation of static electricity which might damage the semiconductor components contained in the electronic circuit packages. Further, the apparatus is equipped with a ground wire (not shown) connected to the housing for attachment to an external ground circuit (not shown) to drain static charges away from the apparatus. The apparatus also includes index plate or receptacle 26 adapted to support burn-in board 28 fully loaded with a plurality of electronic circuit packages (not shown) which have been tested and now must be unloaded from the burn-in board. As shown in FIG. 1 the index plate is in a first position fully extended from the apparatus enabling the burn-in board to be placed thereon. FIG. 2 shows the apparatus with the shroud removed, revealing the apparatus housing as hereinafter described, and with the index plate shifted from its first position into the apparatus. Identical pairs of inner and outer shroud mounting rails 30 and 32 are mounted along the right and left edges of the base plate and define right and left grooves for receipt of the lower longitudinal edges of the shroud. The shroud may be bolted to the base plate or may be attached by any other appropriate means.

Figure 7:
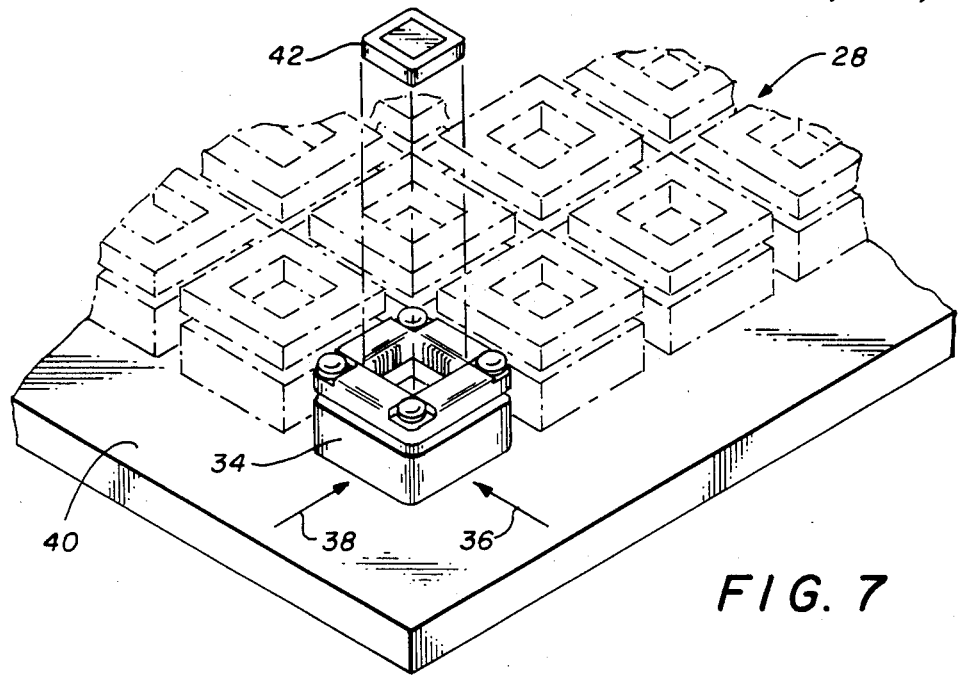
FIG. 7 is a magnified, partially exploded view of the burn-in board of FIG. 1.

FIG. 7 shows in detail a portion of burn-in board 28. Zero insertion force sockets 34 of the type previously discussed are arranged in a rectangular array of rows 36 and columns 38 and soldered to printed circuit burn-in board 28. Although not shown in FIG. 7, each of the sockets includes a plurality of rigid leads extending downwardly through openings in the printed circuit board. In the illustrated embodiment, the sockets are each adapted to receive leadless chip carrier 42, although it is recognized that the present invention may be adapted for use with zero insertion force sockets used with other types of electronic circuit packages such as DIPS. In any case, the sockets must be compressed in order to receive or release the electronic circuit packages and are biased to an engaged position.

Returning to FIGS. 1 and 2, index plate 26 includes generally rectangular opening 44 having a length and width less than the length and width of the burn-in board. Front locater plate 46 and rear locator plate 48 are mounted on the index plate at the front and rear ends, respectively, of the index plate opening. The front and rear locator plates are generally C-shaped and extend along the end edges of the opening and partially along the longitudinal edges thereof. The index plate opening and the front and rear locator plates are constructed and positioned on the index plate to enable burn-in board 28 to be placed on the index plate in an inverted position with the array of sockets, each loaded with an electronic circuit packages, extending downwardly through the opening and prevented from horizontal movement by the front and rear locator plates. Handle 50 is formed on the front or exposed end of the index plate. A pair of parallel guide rails 52 are mounted on the bottom of the index plate along opposite longitudinal edges thereof by four rail mounting blocks 54. Stop block 56 is transversely mounted on the upper surface of the index plate adjacent the rear end thereof.

Referring now also to FIGS. 3–6, in which the index plate has been removed from the apparatus for clarity, the apparatus housing further includes right bearing plate 62 and left bearing plate 64 mounted on the base plate along opposite sides thereof. The bearing plates are secured on the base plate by screws or bolts or any other conventional means. Similarly, all other structural support members included in the apparatus housing described hereinafter are mounted on the base plate or to each other in the same or equivalent fashion. Front bearing rail 68 and rear bearing rail 66 are transversely mounted on the bearing plates above the base plate. Right upright 70 and left upright 72 are mounted on the base plate on the outside of right bearing plate 62 and left bearing plate 64. Air control mounting bracket 74 is mounted on the base plate at the rear end thereof. Right bridge upright 76 and left bridge upright 78 are mounted on the base plate adjacent opposite edges of the air control mounting plate. Bridge plate 80 is mounted transversely on the right and left bridge plates. Shroud mounting rail (not shown) is mounted on the front bearing rail transverse to the longitudinal axis of the housing and includes a groove extending along its length adapted to receive the front edge of the shroud.

Four bearings 84 are mounted on the front and rear bearing rails in two spaced longitudinally aligned pairs, each pair aligned with the longitudinal axis of the housing. Preferably, the bearings are of the recirculating ball bearing type. The guide rails of the index plate are positioned and constructed of a size and shape so as to enable the guide rails to be inserted into and maintain a simultaneous sliding engagement with bearings 84 while supporting the index plate above the bearings. The shroud includes an opening (not shown in FIG. 1) in its front end enabling the index plate to be inserted within the shroud and into engagement with the bearings. When the guide rails are in engagement with the bearings, the index plate is capable of reciprocal horizontal movement parallel to longitudinal axis 14 of the apparatus. The travel of the index plate with respect to the apparatus is limited between a first fully extended position (as shown in FIG. 1) and a second fully inserted position (not shown) in which substantially the full length of the index plate is contained within the shroud.

Means are included to provide a motive force to move the index plate between its first and second positions. As is shown also in FIGS. 8A and 8B, motor upright 86 is mounted on the base plate between the right and left bearing plates and supports motor 88. A drive mechanism is provided to transmit the torque generated by the motor to other parts of the apparatus and to convert the rotary power into linear movement of the index plate. The drive mechanism includes drive gear 90 mounted on the shaft of the motor and extending through the motor upright toward the left bearing plate. Gear drive mounting plate 92 is mounted on the base plate adjacent the right bearing plate 62. Drive shaft 94 is rotatively mounted at one end on left bearing plate 64 and on the other end to the gear drive mounting plate. The drive shaft includes large transfer gear 96 mounted on the drive shaft adjacent the left bearing plate and positioned to engage the drive gear on the motor shaft.

The other end of the drive shaft includes clutch transfer gear 98 adjacent the gear drive mounting plate. Clutch drive gear 100 is rotatively mounted on the drive gear mounting plate above the drive shaft and is positioned to engage the clutch transfer gear. Clutch 102, shown in FIG. 3 in a disengaged position, is connected to the clutch drive gear. Clutch piston 104, shown in FIG. 3, is attached to the clutch and shifts the clutch between engaged and disengaged positions but is biased to a disengaged position. When the clutch is engaged by the clutch piston, the clutch drive gear is shifted toward the gear drive mounting plate to engage the clutch transfer gear. When the clutch is disengaged, the clutch drive gear is shifted away from the gear drive mounting plate, as shown in FIG. 3, and is pulled out of engagement with the clutch transfer gear. Index plate drive gear 106 is rotatively mounted on the drive gear mounting plate above the clutch drive gear and is positioned to engage the clutch drive gear when the clutch drive gear is engaged with the clutch transfer gear. Index plate rack gear 108 is mounted on the underside of the index plate along the right longitudinal edge thereof. When the guide rails of the index plate are engaged with the bearings, the index plate rack gear will be engaged with the index plate drive gear. In this manner, the rotational force of the motor is converted to a linear force inducing longitudinal movement of the index plate between its first and its second positions. The drive gear, drive shaft, transfer gear, clutch transfer gear, clutch drive gear index plate drive gear, and index plate rack gear all form part of the drive mechanism of this invention for transmission of power from the motor.

Figure 11:
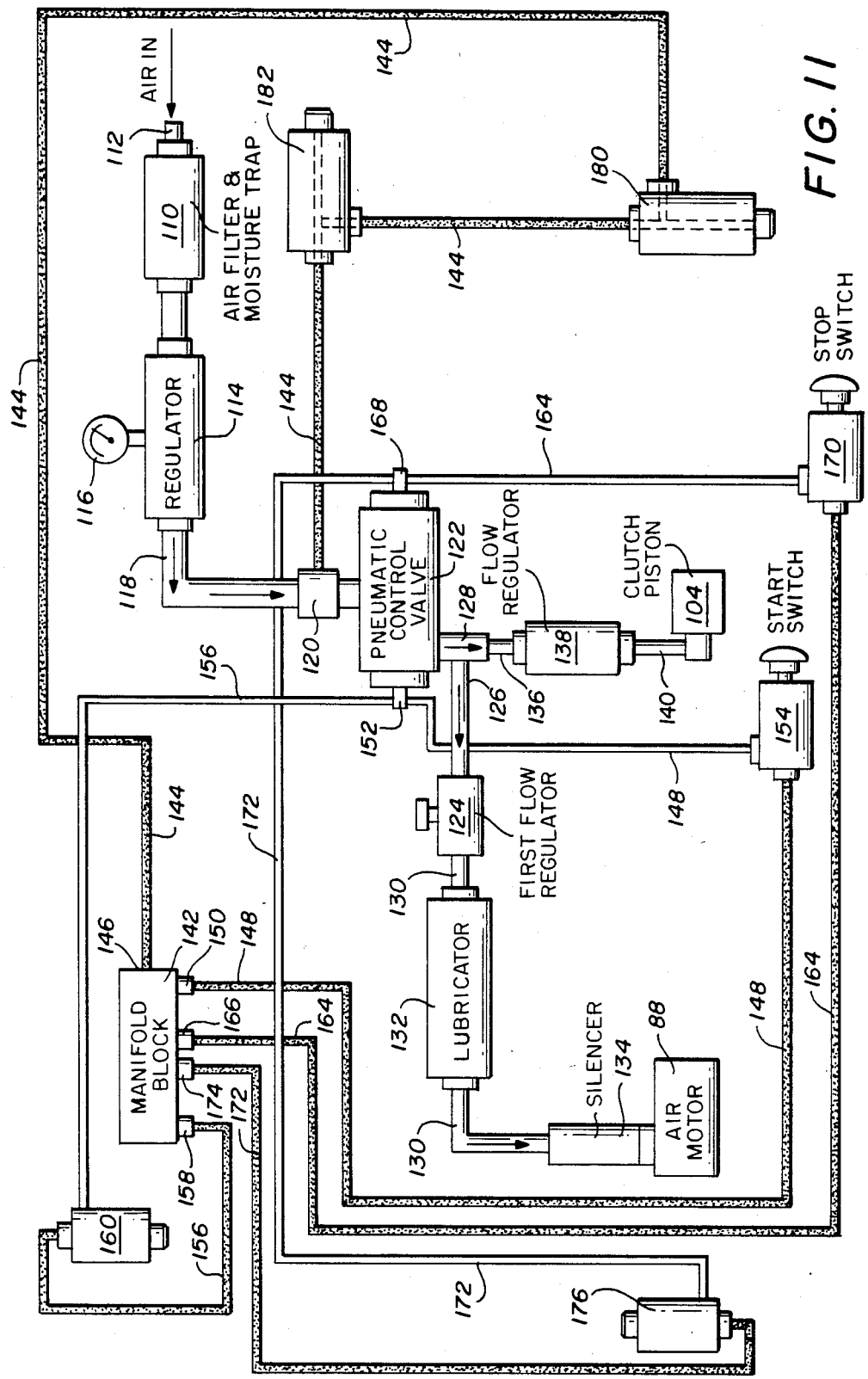
FIG. 11 is a schematic representation of the pneumatic system of the apparatus of this invention.

Motor 88 may be an electric motor or powered by any other conventional means. However, in the preferred embodiment of the invention the motor is a pneumatic motor powered by a source of compressed air (not shown). The use of pneumatic pressure to power the motor avoids the possibility of damage to the semiconductor components inherent in the use of electrically powered equipment. For the purposes of clarity, the conduits forming the pneumatic system powering the motor have been omitted from FIGS. 1–6, 8A and 8B. However, FIG. 11 schematically shows the pneumatic control system including filter and moisture trap 110 (shown in FIG. 6) on the air control mounting plate and connected by conduit 112 to the source of pressurized air. The filter and moisture trap acts to remove contaminants and moisture from the incoming air supply that might otherwise corrode the motor or other elements of the pneumatic control system. The output of the filter and moisture trap is connected to pressure regulator 114 which is mounted on the air control mounting plate for controlling the pressure of the air supplied to the motor to desired levels. Pressure gauge 116 is mounted on the pressure regulator and indicates the pressure of the air supplied to the pneumatic system of the apparatus downstream of the pressure regulator. The pressure regulator is connected by conduit 118 to inlet 120 of the pneumatic control valve 122 mounted on the opposite surface of the air control mounting plate and shown in FIGS. 3 and 4.

First flow regulator 124 is mounted on the air control mounting plate and is connected by conduit 126 to outlet 128 of the air control valve. The flow regulator controls the rate of air flow downstream of the pneumatic control valve to the motor. Motor 88 is connected by conduit 130 to first flow regulator 124 so that the speed of the motor may be adjusted by altering the flow rate of the pressurized air from the first flow regulator. Lubricator 132 is interposed into conduit 130 to provide lubricating oil into the motor. Silencer or muffler 134 is also interposed into conduit 130 downstream of the lubricator to reduce the noise produced by the motor during operation. Conduit 136 connects second flow regulator 138 to outlet 128 of the pneumatic control valve. Clutch piston 104 is connected to the second flow regulator by conduit 140 for shifting the clutch piston to an engaged position in the presence of compressed air and to enable the flow of compressed air supplied to the clutch piston to be controlled independently from the compressed air supplied to the motor.

Manifold block 142 is mounted on the air control mounting plate adjacent the pneumatic control valve. Conduit 144 is connected at one end to inlet 146 of the manifold block and at the other to conduit 118 upstream of the pneumatic control valve and therefore provides the manifold block with compressed air independent of the status of the pneumatic control valve. Conduit 148 is connected at one end to orifice 150 of the manifold block and at the other end to first pilot port 152 of the pneumatic control valve. Start switch 154 is inserted in-line in conduit 148 and is mounted on right upright 70 facing away from the housing. Conduit 156 is connected on one end to orifice 158 of the manifold block and commonly connected at the other end with conduit 148 to first pilot port 152 of the pneumatic control valve. Normally closed front limit switch 160 is inserted in-line in conduit 156 and is mounted by switch bracket 162 on the rear bearing plate facing toward the air control mounting plate. Conduit 164 is connected at one end to orifice 166 of the manifold block and at the other end to second pilot port 168 of pneumatic control valve 122. Emergency stop switch 170 is inserted in-line in conduit 164 and is mounted on right upright 70 above the start switch and facing outwardly of the drive mechanism. Conduit 172 is connected at one end to orifice 174 of the manifold block and commonly connected at the other end with conduit 164 to second pilot port 168 of the pneumatic control valve. Normally closed rear limit switch 176 is inserted in-line in conduit 172 and is mounted by switch bracket 178 on the left end of the rear bridge plate facing the bearing plates. The manifold block is constructed to carry compressed air to each of the start switch, emergency stop switch, front limit switch and the rear limit switch through the various conduits.

The pneumatic control valve includes an internal piston (not shown) which is shiftable between two positions. In the first position, compressed air is enabled to flow through the pneumatic control valve from the inlet to the outlet and thereon to the motor and the clutch. In the second position, the piston blocks the flow of compressed air through the pneumatic control valve and disables the motor and the clutch. The position of the piston is determined by the differential pressure acting on the piston between the first pilot port and the second pilot port. In the absence of compressed air in either of the first and the second pilot ports, the piston of the pneumatic control valve is biased to the second, blocked position.

If the start switch is manually shifted to an open position, compressed air will flow past the start switch through conduit 148 into the first pilot port of the pneumatic control valve. However, as previously discussed the piston of the pneumatic control valve is biased to the second position in which the pneumatic control valve is closed. In this position, the force exerted by the compressed air in the first pilot port from conduit 148 is insufficient to shift the piston to its first position. Only if the normally closed front limit switch is opened simultaneously with the manual opening of the start switch will compressed air flow through the front limit switch and sufficient pressure be placed on the piston from the first pilot port to shift it into its first position and enable the compressed air to flow through the pneumatic control valve and reach the motor and clutch. Once the front safety limit switch has been shifted to an open position and the start switch has been opened, the front safety limit switch is automatically maintained in an open position until conduit 156 is depressurized. It then automatically returns to a closed state. Further, once the piston assumes its first position it is maintained in that position by the force exerted by the compressed air in the first pilot port until either the normally closed rear limit switch or the emergency stop switch are opened. In that case, pressurized air flows from the manifold block through either conduit 164 or conduit 172 into the second pilot port of the pneumatic control valve. The pneumatic control valve is constructed such that the presence of compressed air in the second pilot port from either of the conduits connected thereto will be sufficient to shift the piston to its second position against the force of the compressed air in the first pilot port and cut off the flow of compressed air to the motor and clutch downstream of the pneumatic control valve.

As an additional safety feature, first shunt 180 and second shunt 182 are each interposed in-line into conduit 144 extending from conduit 118 to the inlet of the manifold block and are normally closed. First shunt 180 is mounted on the top of the bridge plate and second shunt 182 is mounted on top of the rear bearing plate. Both shunts are normally closed and positioned so as to contact the shroud when the shroud is mounted on the base plate. When the shroud is properly mounted on the base plate, the shroud contacts both shunts and shifts them to an open position enabling the flow of the pressurized air to the manifold block. If the shroud is inadvertently or deliberately removed, the first and second shunts are automatically closed blocking the flow of compressed air to the manifold block and preventing the shifting of the pneumatic control valve piston to its first position and, consequently, transmission of pressurized air to the motor and clutch.

In operation, burn-in board 28 is positioned on index plate 26 in an inverted position with the index plate in its first position as shown in FIG. 1. Front limit switch 160 is in contact with stop block 56 on the index plate, thereby shifting the front limit switch to an open position. The start switch is then manually opened, shifting the pneumatic control valve piston to its first position and supplying the pressurized air to the motor through conduit 130. The motor applies torque to the drive gear and, through the transfer gear of the drive shaft, begins to rotate the drive shaft. The clutch piston is actuated by the pressurized air supplied by the pneumatic control valve through conduit 136, shifting the clutch and the clutch drive gear toward the gear drive mounting plate and into engagement with the clutch transfer gear and the index plate drive gear. The clutch transfer gear on the drive shaft rotates the clutch drive gear and the index plate drive gear. Rotation of the index plate drive gear is converted by the index plate rack gear into horizontal motion in direction 184 (as shown in FIGS. 8A and 8B) of the index plate toward its second position. If a predetermined amount of resistance is encountered by the index plate or the drive mechanism as the index plate is being shifted to its second position, the clutch slips and disengages the clutch drive gear from the clutch transfer gear on the drive shaft to stop the motion of the index plate. Alternatively, the motion of the index plate may be interrupted at any time by the manual actuation of the emergency stop switch.

As the index plate achieves its second position, stop block 56 mounted on the index plate contacts the rear limit switch and opens it. Rear limit switch 176 then automatically interrupts the supply of pressurized air to the motor by shifting the piston of the pneumatic control valve into its second position and halts motion of the index plate. In addition, the supply of compressed air to the clutch piston is also interrupted so that the clutch and clutch drive gear are automatically disengaged. The index plate may then be manually returned to its first position without resistance by grasping the handle in the index plate and pulling the index plate outward from the apparatus in direction 186 (as shown in FIGS. 8A and 8B) to the first position of the index plate and the front safety limit switch is contacted. Once the front limit switch is opened, the motor may be activated again by manual opening of the start switch. In an alternate embodiment of the invention, the index plate is returned to its first position by reversing the motor rather than by manual force. Further, it is possible to substitute a pneumatic cylinder, mounted on one end to the base plate or to the air control mounting plate and connected at the other end to the index plate, for the motor.

Referring now to FIGS. 8A, 8B, 9 and 10, roller 190 is rotatively supported at each end by right chute holder 192 and left chute holder 194 in a horizontal position transverse to the longitudinal axis of the apparatus. The roller is positioned at a desired predetermined point along the longitudinal axis of the housing. The right chute holder is mounted on the right upright and the left chute holder is mounted in an aligned position on the left upright so as to place the roller beneath the index plate. The diameter of roller 190 and the position of the roller with respect to the index plate will place the roller in compressive rolling contact with the inverted sockets on the burn-in board as the index plate shifts between its first and second positions. That is, the uppermost point on the roller is higher than the lowermost point of the sockets on the burn-in board when supported by the index plate. As each sequential row of sockets is passed over the roller at the predetermined point along the longitudinal axis of the apparatus, the sockets in a particular row will be simultaneously compressed by the roller and the electronic circuit packages released therefrom. After the electronic circuit packages are released from the sockets, they will fall from the sockets under the influence of gravity, thereby unloading the sockets. At the same time, the roller is rotated in clockwise direction 188 (as seen from the right side of the apparatus) due to the frictional contact with the sockets.

Means are provided to receive the electronic circuit packages as they fall from the sockets. In the illustrated embodiment of the invention the receiving means takes the form of spaced concentric slots 196 formed in roller 190. A slot is formed for each column of the sockets in alignment therewith. Each of the slots is adapted to receive the electronic circuit packages at the uppermost point of the slot on the roller and are at least slightly wider and deeper than the width and thickness of the electronic circuit packages. In the preferred embodiment of the invention each of the slots includes spaced pairs of O-rings 198 positioned on the roller in alignment with the columns of sockets with one of the O-rings in each pair adjacent one of the edges of the slot. The tops of each pair of O-rings resiliently contacts and compresses the aligned sockets as the burn-in board moves past the slotted roller. The unloaded electronic circuit packages are received in the slots between the O-rings. Of course, it is possible to omit the O-rings and construct the roller so that it contacts the sockets directly. Rear stop plate 200 is mounted on spacer 202, which is mounted on front bearing rail 66. The rear stop plate includes a plurality of fingers 204, each interposed in one of the slots on the roller between the pairs of O-rings. The lower surfaces of the fingers adjacent the roller are preferably concave and concentric to the roller and closely positioned to the bottom of the slots by a distance less than the thickness of one of the electronic circuit packages. The fingers of the rear stop plate act to prevent any of the electronic circuit packages from falling off the roller in the wrong direction.

Figure 9:
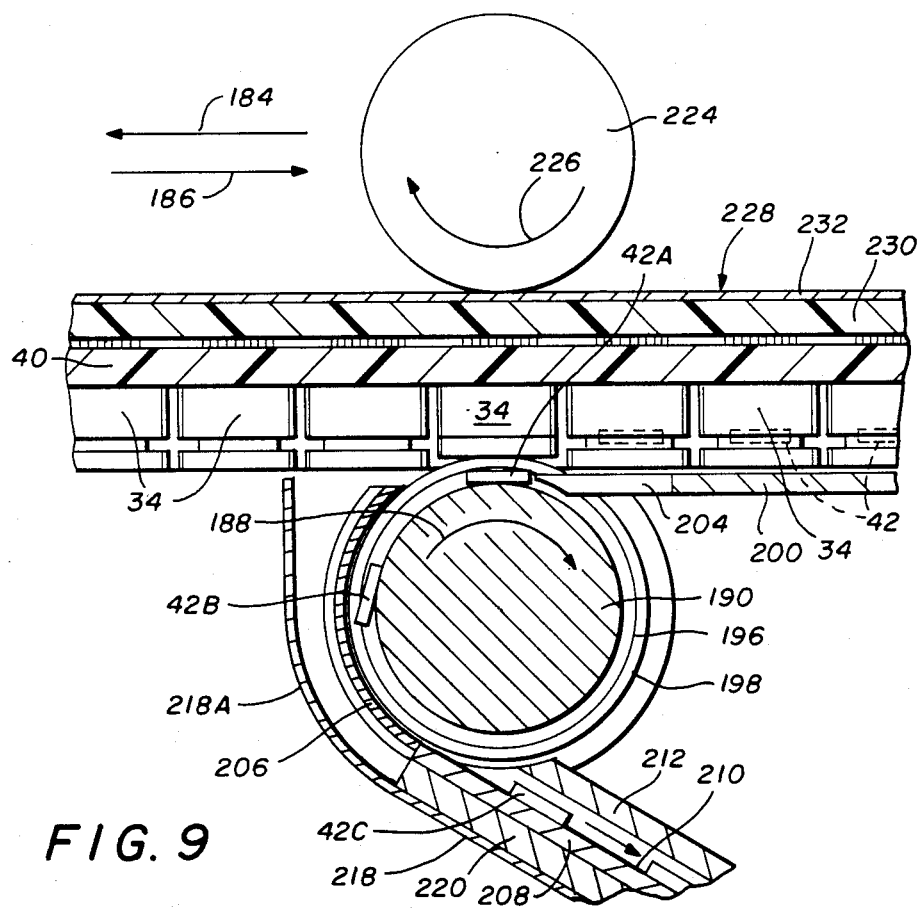
FIG. 9 is a schematic cross-sectional view of the slotted roller, pressure roller, index plate, burn-in board and pad of the apparatus of FIG. 2.
Figure 10:
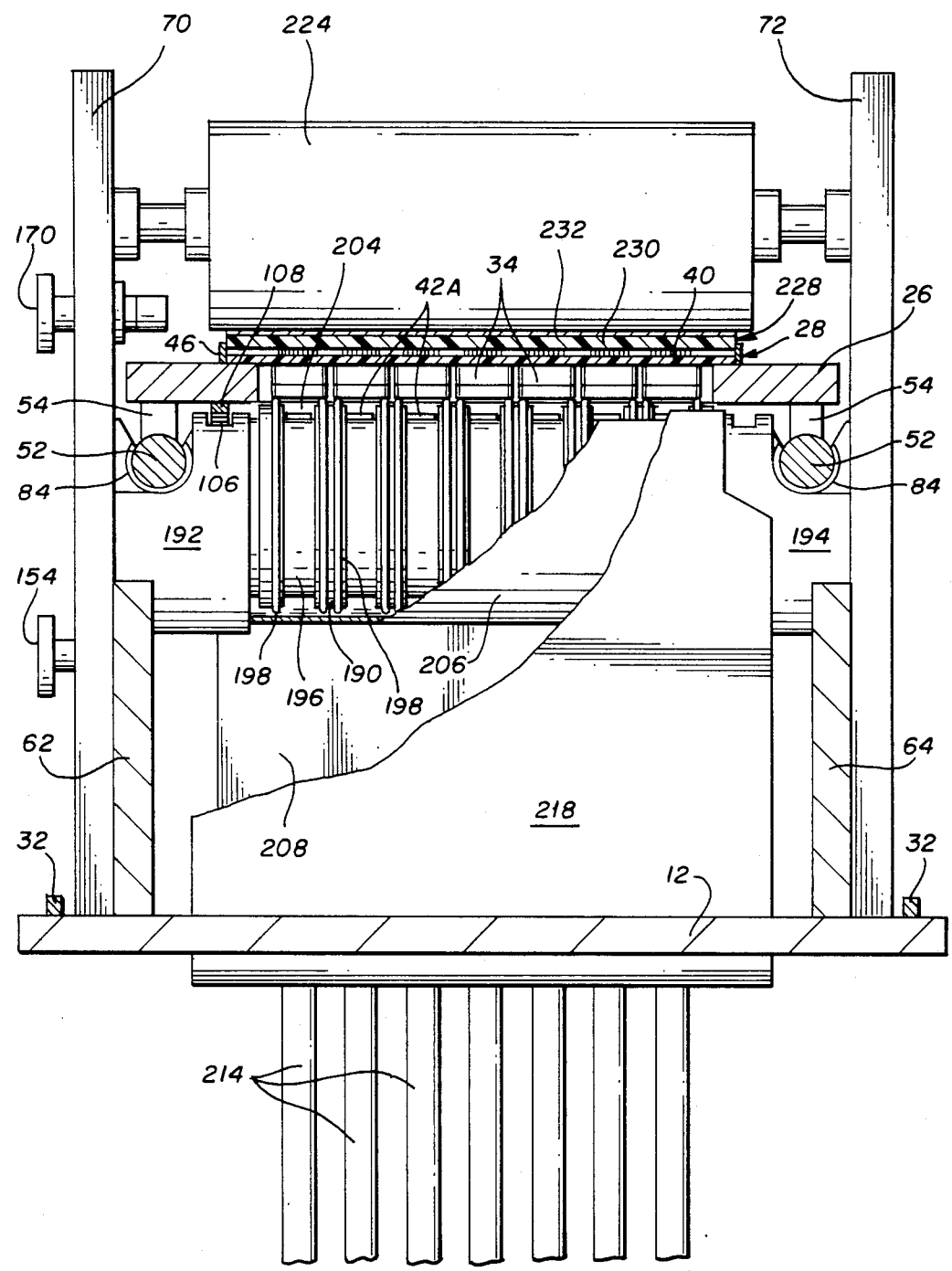
FIG. 10 is a cross-sectional view of the apparatus along view 10—10 of FIG. 2.

In FIGS. 8A, 8B and 9, electronic circuit package 42A has just been unloaded from socket 34 on the burn-in board and has fallen into aligned slot 196 on the roller at the topmost point thereon. Although not shown, an identical electronic circuit package has been deposited in the same position in each of the other slots on the roller. As the roller rotates and additional electronic circuit packages are released from subsequent rows of sockets on the burn-in board, packages previously received by the slots will be continuously carried by the slots in clockwise direction 188 away from the uppermost position on the slot as illustrated by the electronic circuit package labeled 42B. As the roller continues to rotate, the rows of electronic circuit packages carried in the slots are rotated on the roller to a point where they fall from the slots on the roller as illustrated by the electronic circuit package labeled 42C.

Means are provided to capture and store the electronic circuit packages as they leave the slots on the roller. In the illustrated embodiment the means includes wiper 206 forming a concave surface, preferably concentric with but spaced apart from the outer surface of the roller, mounted on either edge to the right and left chute holders on the underside of bearing rail 68 beneath the roller. Also mounted on the either end to the left and right holders is chute 208 having an upper edge adjacent the lowermost edge of the wiper. The chute is inclined at an angle, which in the illustrated embodiment is 30°, toward the front of the apparatus. The chute includes a plurality of parallel longitudinal channels 210 (partially shown in FIGS. 2 and 4) each aligned with one of the slots on the roller and having a width slightly greater than that of the electronic circuit packages. Chute 208 includes a chute cover plate 212 mounted on the chute and enclosing most of the length of the channels on the chute. The chute cover plate presents a concentric curved upper edge to the roller.

A plurality of carrier tubes 214 may be used in conjunction with the apparatus of this invention, each adapted to receive and store the electronic circuit packages in end-to-end relation. Tube retaining bar 216 is transversely mounted on the chute adjacent the lowermost edge thereof. The carrier tubes are each inserted into one of the channels of the chute beneath the tube retaining bar until the foremost ends of the carrier tubes contact shoulders 217 of the chute. The tube retaining bar includes means for securing the carrier tubes within the channels. In the illustrated embodiment, the securing means takes the form of a plurality of spring biased knobs (not shown) mounted in and projecting downwardly from the tube retaining bar over each of the channels. The knobs exert sufficient frictional force on the carrier tubes to retain the carrier tubes in the channels but permit the tubes to be removed when desired. Catch tray 218 is mounted on either end to the right and left chute holders beneath the chute separated from the underside of the chute by a pair of catch tray spacers 220 mounted along opposite edges thereof. The catch tray includes an arcuate section 218A extending generally concentrically about the slotted roller but having an upper edge higher than the top of the wiper and extending beyond the edges of the wiper from side to side. The catch tray also includes a lower section 218B extending downwardly parallel with the underside of the chute and terminating in an upwardly extending lip 222 along the full width thereof.

In operation, the slotted roller compresses each sequential row of loaded sockets on the burn-in board as the index tray is shifted by the motor from its first position to its second position in one continuous motion. Each row of electronic circuit packages is caught in the slots on the roller and carried along as the roller rotates until the row of electronic circuit package fall off the roller. The wiper catches the row of electronic circuit packages as they fall from the slots on the roller and directs the electronic circuit packages to the chute. Each of the electronic circuit packages in the row slides into one of the aligned channels on the chute as illustrated by the electronic circuit package labeled 42D. After sliding down the channel, the package is received in the carrier tube that is inserted in each channel as illustrated by the electronic circuit package labeled 42E. Subsequent rows of the electronic circuit packages follow a similar path and are placed in the carrier tubes in sequential end-to-end relationship. The carrier tubes are easily replaced with empty carrier tubes when filled. If any of the electronic circuit packages do not fall on the wiper, the catch tray serves as a backup to capture the packages which slide down the catch tray and are deposited on lip 222 until manually retrieved by an operator. However, it is anticipated that the wiper will effectively capture substantially all the electronic circuit packages falling from the roller. In this manner the burn-in board is quickly and conveniently unloaded at rates up to 10,000 electronic circuit packages hour. Once the index plate reaches its second position and contacts the rear limit switch it may be manually returned to its first position and the unloaded burn-in board removed and replaced by a new burn-in board requiring unloading.

Due to the size, shape and thickness of the printed circuit boards used in most burn-in boards, the burn-in boards exhibit a large degree of flexibility. Therefore, the printed circuit board on which the sockets are mounted may give or bow when the sockets mounted thereon are placed in compressive rolling contact with the roller. If the bowing is sufficiently large, some or all of the sockets will not be compressed and consequently the electronic circuit packages contained therein will not be released. To counteract this undesirable feature and to support the burn-in board while the electronic circuit packages are being unloaded, pressure roller 224 is rotatively mounted on the right and left uprights 70 and 72 above the index plate and transversely to the longitudinal axis of the housing. The pressure roller extends horizontally and is positioned directly over the slotted roller. The center to center distance between the axis of rotation of the slotted roller and the pressure roller is adjusted so that the pressure roller is placed in rolling contact with the uppermost surface of the burn-in board (i.e. the surface without the sockets when inverted and mounted in the index plate). However, the pressure roller does not exert any independent force on the burn-in board but rotates in counterclockwise direction 226 (as seen from the right side of the apparatus) as the index plate and the burn-in board move to the second position. The pressure roller does exert a counter force to the compressive force exerted by the slotted roller on the sockets as the electronic circuit packages are being unloaded. The pressure roller may be constructed of a rigid material such as metal. Alternatively, the pressure roller or its outer layer may be constructed of a resilient or pliable material such as rubber.

In the preferred embodiment of the invention the pressure roller is constructed of a conductive rigid material and pad 228 (also shown in FIG. 1) is interposed between pressure roller 224 and the burn-in board. Pad 228 includes cushion layer 230 which is constructed of resilient material such as rubber and placed face down in contact with the leads (not shown) of the sockets extending through the burn-in board. The pad also includes rigid layer 232, which may comprise a metal plate, bonded to the cushion layer and placed uppermost and in rolling contact with the pressure roller. The pad does not reduce the effectiveness of the pressure roller. However, it acts to protect the leads of the sockets or any other components which may be damaged while the electronic circuit packages are being unloaded.

Figure 12:
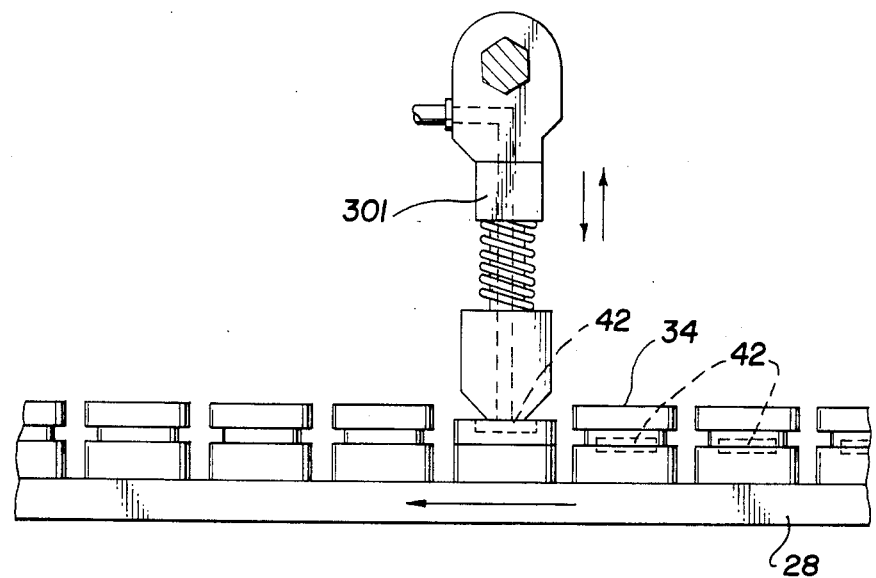
FIG. 12 is an illustration of a vacuum rod for removing electronic circuit packages from the sockets.
Figure 13:
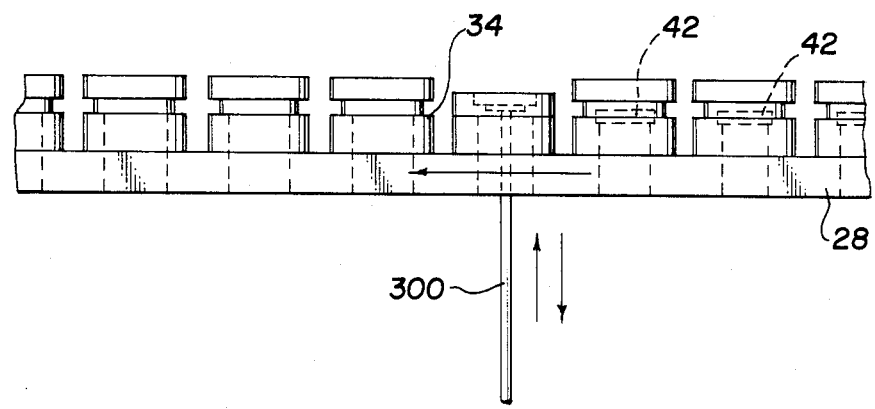
FIG. 13 is an illustration of a plunger for pushing electronic circuit packages upwardly out of the sockets from the underside.

From the foregoing it will be seen that this invention is one well adapted to obtain all of the ends, features and advantages hereinabove set forth. together with other advantages that are obvious and that are inherent to the apparatus and method. It will also be understood that certain features and subcombinations are of utility and may be employed without reference to other features and subcombinations. This is contemplated by and is within the scope of the claims. Although the invention has been disclosed above with regard to particular and preferred embodiments, these are advanced for illustrative purposes only and are not intended to limit the scope of this invention. For instance, it is possible to adapt the channels of the chute to directly receive and store the electronic circuit packages from the burn-in board in end to end relation and to omit the carrier tubes. Further, it is possible to place the sockets of the burn-in board in compressive rolling contact with a roller while in an upright position. In such an embodiment it would be necessary to replace the force of gravity with a mechanism for extracting the electronic circuit package from the sockets as the sockets are compressed by the roller. For instance, a rod 301 having an internal vacuum may be inserted into the sockets to pick up the electronic circuit packages and lift them out of the sockets as illustrated in FIG. 12. Alternatively, a vacuum may be used to suck the electronic circuit package out of the sockets without contacting the packages directly. In yet another alternative, the sockets may be provided with an aperture beneath the electronic circuit packages and a mechanism provided to insert a plunger 300 upwardly through the aperture into contact with the underside of the electronic circuit package to push it upwardly out of the socket as illustrated in FIG. 13. A burst of compressed air could be substituted for the plunger to force the electronic circuit package out of the socket. These variations remain within the invention as claimed below. Although not shown, the apparatus of this invention may be adapted to unload an electronic circuit package from a single socket, whether mounted on a burn-in board or not, as well as a single row or column of sockets.

What is claimed is:

1. Apparatus for unloading an electronic circuit package from a zero insertion force socket comprising:
   (a) a housing having a receptacle adapted for holding the socket containing the circuit package;
   (b) means mounted on said housing for compressing the socket;
   (c) means mounted in said housing for moving said receptacle and the socket with respect to said housing and into engagement with said compressing means so as to release the electronic circuit package from the socket; and
   (d) means mounted on said housing for extracting the electronic circuit package from the socket after being released therefrom.

2. The apparatus of claim 1 wherein the socket includes an opening communicating with the electronic circuit package and wherein said extraction means includes:
   a plunger mounted on said housing and adapted for reciprocal motion through the opening in the socket to expel the electronic circuit package from the socket while the socket is compressed by said compressing means.

3. The apparatus of claim 1 wherein said extraction means includes:
   vacuum means mounted on said housing adapted for reciprocal motion into the socket and to grip the electronic circuit package by suction to extract the electronic circuit package therefrom while the socket is being compressed by said compressing means.

4. The apparatus of claim 1 wherein;
   (a) said compressing means includes a roller rotatively supported by said housing; and
   (b) said means for moving said receptacle and the socket into engagement with said compressing means places said roller in rolling compressive contact with the socket to rotate said roller and release the electronic circuit package from the socket.

5. The apparatus of claim 4 wherein said extraction means comprises:
   (a) said receptacle adapted for holding the socket containing the circuit package in an inverted position above said roller; and
   (b) said roller includes a concentric slot aligned with the socket, said slot adapted to receive the electronic circuit package from the socket when the socket is compressed by said slotted roller. including:

6. The apparatus of claim 5 further including a carrier tube mounted on said housing beneath said roller and aligned with said slot, said carrier tube adapted to receive the electronic circuit package from said slot on said roller as said roller rotates in rolling compressive contact with the socket.

7. Apparatus for unloading an electronic circuit package from a zero insertion force socket comprising:
   (a) a housing having a receptacle adapted for holding the socket containing the circuit package in an inverted position;
   (b) a roller rotatively supported by said housing beneath said receptacle;
   (c) means mounted in said housing for moving said receptacle and the socket with respect to said roller and to place said roller in compressive rolling contact with the socket to release the electronic circuit package from the socket; and
   (d) means mounted in said housing for receiving the electronic circuit package as it falls from the socket.

8. The apparatus of claim 7 wherein said receiving means comprises a concentric slot formed on said roller and aligned with the socket with said slot adapted to receive the electronic circuit package from the socket as said roller compresses the socket.

9. The apparatus of claim 8 wherein said receiving means further comprises a carrier tube mounted on said housing beneath said roller and aligned with said slot with said carrier tube adapted to receive the electronic circuit package from said slot on said roller as said roller rotates.

10. The apparatus of claim 7 further comprising:
(a) a pad mounted on said receptacle in contact with the uppermost surface of the socket; and
(b) a second roller rotatively supported by said housing above said receptacle opposite said slotted roller and in rolling contact with said pad to support the socket when the socket is being compressed and the electronic circuit package is being unloaded.

11. The apparatus of claim 7 wherein said receptacle is further adapted to hold a plurality of zero insertion force sockets in an inverted position with the sockets being longitudinally aligned in a column wherein said means for moving said receptacle and the sockets with respect to said roller enables said roller to sequentially contact and compress each of the sockets for unloading all of the electronic circuit packages therefrom.

12. The apparatus of claim 7 wherein said receptacle is adapted to support a plurality of zero insertion force sockets in an inverted position with the sockets being transversely aligned in a row with respect to said longitudinal axis of said housing, and wherein said roller is in simultaneous rolling compressive contact with all the sockets and wherein said receiving means is adapted to simultaneously receive all the electronic circuit packages as they fall from their respective sockets.

13. The apparatus of claim 12 wherein said receiving means comprises:
(a) a plurality of concentric slots formed on said roller, each of said slots being aligned with one of the sockets and adapted to receive one of the electronic circuit packages; and
(b) a like number of carrier tubes mounted on said housing beneath said roller, each of said tubes being aligned with one of said slots and adapted to receive an electronic circuit package therefrom as said slotted roller rotates when in compressive rolling contact with the sockets.

14. The apparatus of claims 7, 11 or 12 further comprising:
(a) a pad mounted on said receptacle in contact with the uppermost surface of the sockets; and
(b) a second roller rotatively supported by said housing above said receptacle opposite said slotted roller in rolling contact with said pad to support the sockets as the sockets are being compressed by said slotted roller and the electronic circuit packages are being unloaded.

15. Apparatus for unloading electronic circuit packages from a plurality of zero insertion force sockets arranged in a rectangular array of rows and columns on a burn-in board or the like comprising:
(a) a housing having a receptacle adapted to hold the array of sockets in an inverted position;
(b) a roller rotatively supported by said housing beneath said receptacle and having a plurality of concentric slots, each aligned with one of the columns of sockets, said slots being adapted to simultaneously receive the electronic circuit packages when unloaded from sequential rows of the sockets; and
(c) means mounted in said housing for moving said receptacle and the array of sockets with respect to said slotted roller and placed to rotate said slotted roller and compress the sockets, thereby unloading the electronic circuit packages into said slots on said roller.

16. The apparatus of claim 15, further including a plurality of carrier tubes mounted on said housing beneath said slotted roller, each tube aligned with one of said slots on said roller and adapted to simultaneously receive a row of the electronic circuit packages from said slots as said roller rotates.

17. The apparatus of claim 15 or 16, further comprising:
(a) a pad mounted on said receptacle in contact with the uppermost surface of the sockets; and
(b) a second roller rotatively supported by said housing above said receptacle opposite said slotted roller in rolling contact with said pad to support the sockets as the sockets are being compressed and the electronic circuit packages are being unloaded.

18. Apparatus for unloading electronic circuit packages from a plurality of zero insertion force sockets mounted in a rectangular array of rows and columns on a burn-in board or the like comprising:
(a) a housing defining a longitudinal axis and having an index plate adapted to receive and support the array of sockets in an inverted position with the columns being parallel with said longitudinal axis of said housing, said index plate being capable of reciprocal horizontal movement between first and second positions with respect to said housing parallel with said longitudinal axis thereof;
(b) a roller rotatively mounted on said housing transverse to said longitudinal axis beneath said index plate and in rolling compressive contact with the sockets as said index plate is moved between said first and second positions, said roller having a plurality of spaced concentric slots with each slot aligned with one of the columns of sockets and adapted to receive the electronic circuit packages when unloaded from the sockets; and
(c) means for moving said index plate between said first and said second positions to simultaneously compress each socket in sequential rows of the sockets and unload the electronic circuit packages from the sockets into said slots and to rotate said slotted roller.

19. The apparatus of claim 18 further including a plurality of parallel carrier tubes mounted on said housing and depending downwardly therefrom beneath said slotted roller with each tube aligned with one of said slots on said slotted roller and adapted to receive the electronic circuit packages from said slots as said slotted roller rotates and compresses the sockets.

20. The apparatus of claim 18 wherein the electronic circuit packages are leadless chip carriers.

21. The apparatus of claim 18 wherein the electronic circuit packages are DIPs.

22. The apparatus of claim 18 wherein said means for moving said index plate between said first and second positions includes a motor mounted on said base plate and a drive mechanism mounted on said base plate and engaged with said motor and said index plate to shift said index plate between said first and second positions, parallel with said longitudinal axis of said housing.

23. The apparatus of claim 22 wherein said motor is pneumatically actuated.

24. The apparatus of claim 18 further comprising:
 (a) a pad mounted on said plate over the burn-in board; and
 (b) a second roller rotatively supported by said housing above said index plate and opposite said slotted roller and in rolling contact with said pad to support the sockets as the sockets are being compressed by said slotted roller and the electronic circuit packages are being unloaded.

25. A method for unloading electronic circuit packages contained in a plurality of low insertion force sockets mounted on a burn-in board in a rectangular array of rows and columns comprising the steps of:
 (a) supporting the array of sockets in an inverted position;
 (b) moving the array of sockets past a fixed point;
 (c) compressing the sockets in sequential rows as the sockets pass the fixed point to release the electronic circuit packages contained therein; and
 (d) extracting the electronic circuit packages from the sockets.

26. The method of claim 25 wherein step (c) comprises the steps of:
 (a) providing a roller at said fixed point;
 (b) placing said roller in compressive rolling contact with each row of the array of sockets in sequential order;
 (c) capturing the unloaded electronic circuit packages from the sockets as the array of sockets is moved over the fixed point in contact with said roller.

27. A method for unloading an electronic circuit package contained in a zero insertion force socket comprising the steps of:
 (a) supporting the socket in an inverted position;
 (b) moving the socket past a fixed point;
 (c) compressing the socket as the socket passes the fixed point to unload the electronic circuit package contained therein; and
 (d) capturing the electronic circuit package as it is unloaded from the socket.

* * * * *

UNITED STATES PATENT AND TRADEMARK OFFICE
CERTIFICATE OF CORRECTION

PATENT NO. : 4,660,282
DATED     : April 28, 1987
INVENTOR(S) : Wayne K. Pfaff

It is certified that error appears in the above-identified patent and that said Letters Patent is hereby corrected as shown below:

In Column 4, line 58, delete "of materials that"

In Column 5, line 42, delete "an"

In Column 7, line 7, insert a comma (,) after "gear" (second occurrence) and delete the comma (,) after "gear" (third occurrence)

In Column 12, line 29, after "packages" insert ---per---

In Column 13, line 19, cancel the period (.)

In Column 14, line 41, cancel "includ-"

In Column 14, line 42, cancel "ing:"

In Column 15, lines 19 and 27, cancel "being"

In Column 16, lines 7, 13 and 65, delete the comma (,)
In Column 16, line 29, cancel "being"

Signed and Sealed this

Twentieth Day of October, 1987

Attest:

DONALD J. QUIGG

Attesting Officer          Commissioner of Patents and Trademarks